United States Patent
Chen et al.

(10) Patent No.: US 7,505,147 B1
(45) Date of Patent: Mar. 17, 2009

(54) EFFICIENT CALCULATION OF GRATING MATRIX ELEMENTS FOR 2-D DIFFRACTION

(75) Inventors: Shuqiang Chen, Sunnyvale, CA (US); Guoguang Li, Fremont, CA (US)

(73) Assignee: n&k Technology, Inc., San Jose, CA (US)

( * ) Notice: Subject to any disclaimer, the term of this patent is extended or adjusted under 35 U.S.C. 154(b) by 324 days.

(21) Appl. No.: 11/442,208

(22) Filed: May 26, 2006

(51) Int. Cl.
*G01B 11/24* (2006.01)

(52) U.S. Cl. ................................. 356/601; 356/237.2

(58) Field of Classification Search ... 356/237.1–237.5, 356/445–448, 625–636; 702/66, 155; 430/5, 430/30
See application file for complete search history.

(56) References Cited

U.S. PATENT DOCUMENTS

| | | | | |
|---|---|---|---|---|
| 5,337,146 | A * | 8/1994 | Azzam | 356/367 |
| 6,451,700 | B1 * | 9/2002 | Stirton et al. | 438/695 |
| 6,775,015 | B2 * | 8/2004 | Bischoff et al. | 356/636 |
| 6,867,862 | B2 * | 3/2005 | Nikoonahad | 356/340 |
| 6,867,866 | B1 * | 3/2005 | Chang et al. | 356/446 |
| 6,891,626 | B2 * | 5/2005 | Niu et al. | 356/625 |
| 6,898,537 | B1 * | 5/2005 | McGahan | 702/76 |
| 6,919,964 | B2 * | 7/2005 | Chu | 356/601 |
| 7,029,110 | B2 * | 4/2006 | Takao et al. | 347/100 |
| 7,139,128 | B2 * | 11/2006 | Smith et al. | 359/572 |

OTHER PUBLICATIONS

Han, Soo Ting et al. "Electromagnetic Scattering of Two-Dimensional Surface-Relief Dielectric Gratings" (1992) Applied Optics, vol. 31, No. 13, pp. 2343-2352.
Lalanne, Philippe "Improved Formulation of the Coupled-Wave Method for Tow-Dimensional Gratings" (1997) Journal of Optical Society of America, vol. 14 No. 7 pp. 1592-1598.
Noponen, Eero et al. "Eigenmode Method for Electromagnetic Synthesis of Diffractive Elements With Three-Dimensional Profiles." (1994) Journal of Optical Society of America, vol. 11 No. 9, pp. 2494-2502.
Li, Lifeng "New Formulation of the Fourier Modal Method For Crossed Surface-Relief Gratings." (1997) Journal Optical Society of America, vol. 14, No. 10, pp. 2758-2767.
Hershberger, John et al. "Speeding Up the Douglas-Peucker Line-Simplification Algorithm." pp. 1-16.

* cited by examiner

*Primary Examiner*—Hoa Q Pham
(74) *Attorney, Agent, or Firm*—Lumen Patent Firm (57) ABSTRACT

Improved computation of Fourier coefficients for modeling of 2-D grating diffraction is provided. Let $f(x,y)$ be defined in a region $\Omega$. Typically, $f(x,y)$ is piecewise constant (since it is a grating permittivity or inverse permittivity) and takes on various constant values in several domains in $\Omega$. Let D be one of these domains, having a general shape. According to the invention, D is approximated as a set of trapezoids, and $f(x,y)$ is taken to have a constant value within each of the trapezoids. Since the Fourier coefficient of a constant defined on a trapezoidal region can be analytically evaluated, an analytic approximation to the Fourier coefficient of $f(x,y)$ on D is provided by summing the contributions from each trapezoid.

18 Claims, 8 Drawing Sheets

EFFICIENT CALCULATION OF GRATING MATRIX ELEMENTS FOR 2-D DIFFRACTION

FIELD OF THE INVENTION

This invention relates to approximate evaluation of integrals, especially in connection with modeling the optical response of a 2-D periodic grating.

BACKGROUND

Various applications, such as non-contact optical metrology for semiconductor fabrication, require simulation of the optical response of two-dimensional gratings. The rigorous coupled wave analysis (RCWA) is one of the most important methods for such simulations Two-dimensional RCWA simulation has been considered by Soon Ting Han et al., Applied optics, vol. 31, no. 13, 2343-2352, 1992 and by Philippe Lalanne, J. Opt. Soc. Amer. Vol. 14, no. 7, 1592-1598, 1997. Although the RCWA is a powerful technique, the computational speed has been a serious issue, especially for 2D simulations. In an RCWA simulation, a finite number of diffraction orders are included in a calculation. For example, N orders may be included in a 1-D calculation, while NM orders may be included in a 2-D calculation (N orders in one direction and M orders in another direction). Thus 2-D RCWA calculations typically include a much larger number of orders than 1-D calculation, which undesirably increases computation time.

Accordingly, methods of reducing RCWA computation time for 2-D calculations are of interest. For example, U.S. patent application Ser. No. 11/305,449 by the present inventors considers symmetric 2-D cases where symmetry-induced relations among the diffraction orders are exploited to reduce computation time. However, further reduction in 2-D RCWA computation time is desirable.

In an RCWA calculation, the grating profile is expressed in terms of Fourier coefficients, one coefficient for each retained diffraction order. In the simple case of a grating having rectangular pillars, the Fourier coefficients have simple, well-known analytical expressions. For more complicated grating pillar shapes, standard methods for numerical evaluation of Fourier coefficients are applicable, although they can be time consuming. The time required for calculation of Fourier coefficients tends to be more significant for 2-D gratings, because typically many more Fourier coefficients are needed in a 2-D calculation than in a 1-D calculation. Discussions of the 2-D RCWA in the literature tend to treat the Fourier coefficients of the grating as given quantities (presumably from a numerical integration if necessary), and concentrate on refinements of other steps of the method. For example, Eero Nopomen et al. considers a 2D grating with circular pillars (J. Opt. Soc. Am. A/Vol. 11, No. 9, September 1994), but no details relating to how the Fourier coefficients are obtained is given.

Accordingly, it would be an advance in the art to provide an improved method for evaluating 2-D grating Fourier coefficients having reduced computational time requirements.

SUMMARY

The computation of a Fourier coefficient of a 2-D grating can be formulated as evaluating the Fourier coefficient of a function f(x,y) within a two-dimensional region $\Omega$. General purpose methods for evaluating such coefficients for arbitrary f(x,y) and arbitrary $\Omega$ are well known (e.g., 2-D Gaussian integration) but can be excessively time consuming, as indicated above. In contrast, the invention is based on exploitation of special features of f(x,y) and $\Omega$ that are characteristic of the 2-D grating diffraction problem. In particular, f(x,y) is piecewise constant, and it is also helpful that $\Omega$ can be selected to have a simple shape. (e.g., a rectangle or a square), since $\Omega$ is a grating unit cell. As an example of 2-D piecewise constancy, let $\Gamma$ be a simple closed curve in $\Omega$, let a 2-D domain D be the interior of $\Gamma$, let f(x,y)=$f_1$ in D and let f(x,y)=$f_2$ in the part of $\Omega$ outside of $\Gamma$. Frequently, $f_2$=1, which corresponds to a grating where each unit cell includes one $\Gamma$-shaped pillar surrounded by air/free space. It is convenient to refer to analogous grating features as pillars even if $f_2$ differs from 1 (i.e., the pillars are surrounded by a denser medium than air). It is also important to note that a unit cell (i.e., $\Omega$) can include more than one pillar, and such multiple pillars can have the same shape or can have different shapes.

Since f(x,y) is piecewise constant, the difficulties in calculating the Fourier coefficients arise entirely from the shape of the pillars. Thus pillars having simple shapes (e.g., rectangular pillars) have Fourier coefficients which are trivial to compute, while pillars having a complicated shape have Fourier coefficients which can be time-consuming to compute with generally applicable methods. The basis of the present invention is to provide an approximate tiling (or subdivision) of a general pillar shape (e.g., a 2-D domain D as above) into N regions $R_j$ ($1 \leq j \leq N$), such that each region has a trapezoidal shape, and the totality formed by the regions has a shape which is approximately that of the original pillar. Within each trapezoidal region, a constant approximation $f_j$ to f(x,y) is provided. In some cases, no approximation is necessary to provide $f_j$ (e.g., if $R_j$ is entirely inscribed within D). In other cases, providing $f_j$ entails an approximation (e.g., if $R_j$ includes small regions outside D). The Fourier integral of a constant over a trapezoidal region can be evaluated (preferably analytically) to provide regional coefficients $F_j$. The sum of the regional coefficients, F, is then an approximation to the Fourier coefficient of f(x,y) in D. The contribution of the region of $\Omega$ outside of $\Gamma$ to the grating Fourier coefficient is usually straightforward to account for (since the shape of $\Omega$ is simple).

A conventional numerical evaluation of the Fourier coefficients of f(x,y) would entail a decomposition of $\Omega$ into rectangular or square regions, followed by numerical summation. The present invention provides several advantages compared to this conventional approach. The use of a 2-D trapezoidal decomposition as opposed to a rectangular decomposition provides improved fidelity to the pillar shape (e.g., a trapezoidal approximation to F typically requires fewer "pieces" than a rectangular approximation to $\Gamma$). Another advantage of the invention is that the Fourier coefficients in each trapezoidal region can be evaluated analytically. A further advantage of the invention is that calculations focus on the pillar(s) as opposed to the entire unit cell $\Omega$. This is particularly noteworthy in cases where a large unit cell $\Omega$ includes several identical pillars. Fourier coefficients of such cells can be especially time consuming to compute by conventional methods. Furthermore, most 2-D grating structures have diffraction that is relatively insensitive to minor changes in the shape of the pillars, so errors entailed by the approximations of the present invention tend to be minor.

As described in detail below, grating Fourier coefficients for relative permittivity and/or inverse permittivity can be computed by approximating arbitrary pillar shapes with suitably chosen trapezoids. For grating unit cells including two or more identically shaped pillars, computation time can be reduced by performing detailed calculations for only one of the pillars, and accounting for the other identical pillars via inclusion of appropriately phase shifted terms in the approximation. The present invention can also be practiced in combination with symmetry reduction as in the above referenced patent application Ser. No. 11/305,449, to further reduce computation time for 2-D RCWA calculations.

DETAILED DESCRIPTION

Figure 1:
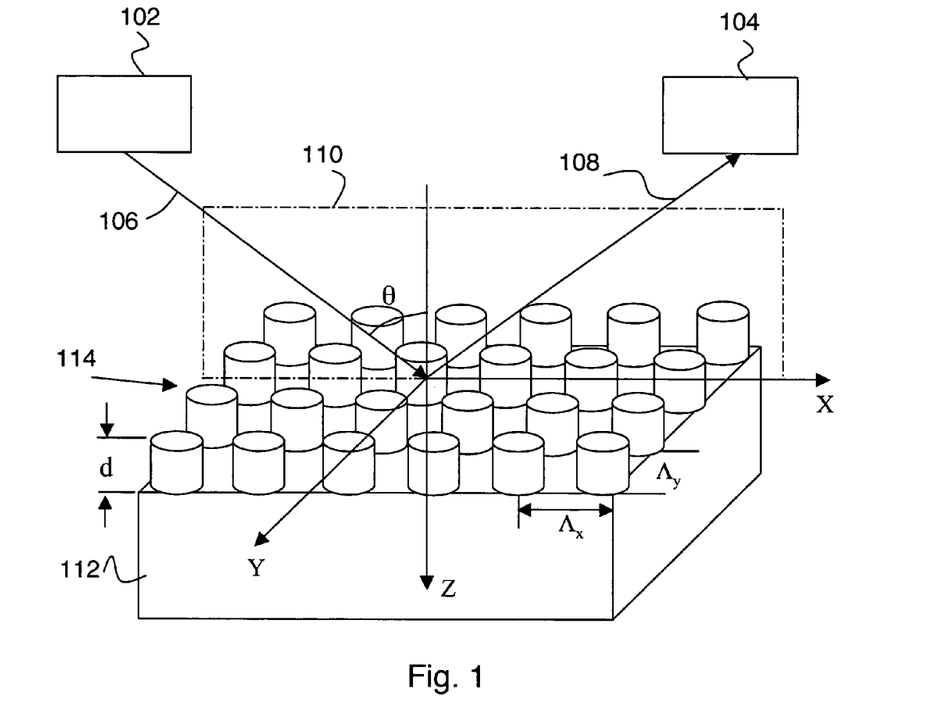
FIG. 1 shows a system suitable for practicing the invention.

FIG. 1 shows a system suitable for practicing the invention. An optical source 102 provides optical radiation 106 to a 2-D grating 114 disposed on a substrate 112. Radiation 108 propagates from the grating and is received by a detector/processor 104. Radiation 108 can be reflected or transmitted radiation, and can include any number of diffracted orders. Typically, as shown here, radiation 108 is specularly reflected light (i.e., zero-order), and plane 110 is the plane of incidence. Radiation 106 can be at multiple wavelengths (e.g., as provided by a broadband optical source, tunable narrow-band source, etc.). In this case a measured spectral (i.e., wavelength dependent) response of the grating is provided. The system processor provides a corresponding modeled spectral response, having parameters of the grating as adjustable parameters. By fitting the modeled spectral response to the measured spectral response, these grating parameters can be determined. The modeled spectral response can be provided by an RCWA calculation (or by any other method that relies on a computation of grating Fourier coefficients). Alternatively, radiation 106 can have a variable angle of incidence, and grating parameters can be determined by fitting a modeled angular response to a measured angular response. In this case as well, a RCWA calculation can be employed to calculate the modeled angular response.

The following description will focus on the computation of grating Fourier coefficients. For simplicity, the grating features are assumed to be z-independent within the grating region, since the extension to z-dependent gratings is given in "Stable implementation of the rigorous coupled-wave analysis for surface-relief gratings: enhanced transmittance matrix approach" by M. G. Moharam et al in J. Opt. Soc. Am. A, vol. 12, no. 5, May 1995, 1077-1086. The extension to z-dependent gratings as described in this article can be practiced in combination with the present invention. In the grating region, the relative permittivity and its inverse can be written as $$\varepsilon(x, y) = \sum_{m,n} \varepsilon_{mn} \exp[j(mK_x x + nK_y y)], \quad (1a)$$

$$\varepsilon(x, y)^{-1} = \sum_{m,n} a_{mn} \exp[j(mK_x x + nK_y y)], \quad (1b)$$

where $K_x = 2\pi/\Lambda_x$, $K_y = 2\pi/\Lambda_y$, and $\Lambda_x$, $\Lambda_y$ are the grating periods in x, y directions respectively. Here $\varepsilon_{mn}$, $a_{mn}$ are the Fourier coefficients of the relative permittivity and inverse permittivity respectively. The pillar shape is described by the given function $\varepsilon(x,y)$. The coefficients $\varepsilon_{mn}$, $a_{mn}$ can be found from Eqs. 1a-b.

Figure 2A:
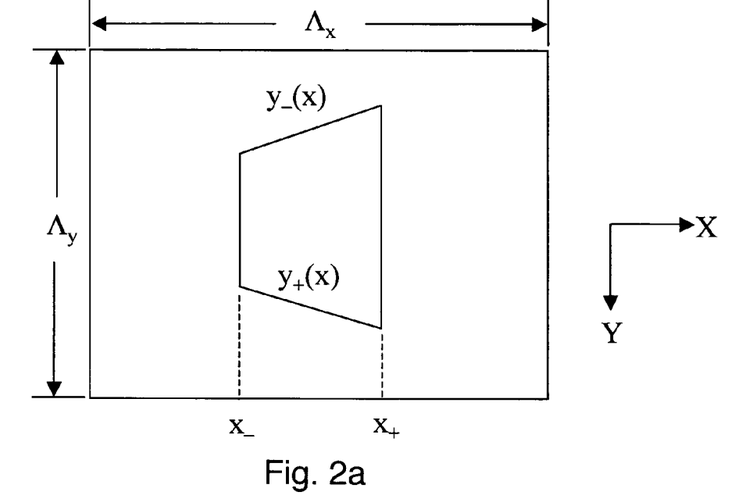
FIGS. 2a-b show trapezoidal cells in accordance with embodiments of the invention.

The top view of a exemplary unit cell is shown in FIG. 2a, where a trapezoidal pillar is in the region $x_- < x < x_+$, $y_-(x) < y < y_+(x)$. For a binary grating having index $n_2$ in the pillar and $n_1$ outside the pillar, Eqs. 1a-b give:

$$\varepsilon_{mn} - \frac{1}{\Lambda_x \Lambda_y}(n_2^2 \cdot I_{A,mn} + n_1^2 \cdot I_{B,mn}) = \quad (2a)$$

$$\begin{cases} \frac{n_2^2 - n_1^2}{\Lambda_x \Lambda_y} I_{mn}, m, n \neq 0 \\ (n_2^2 - n_1^2)\frac{A}{\Lambda_x \Lambda_y} + n_1^2, m = n = 0 \end{cases}$$

$$a_{mn} = \frac{1}{\Lambda_x \Lambda_y}\left(\frac{I_{A,mn}}{n_2^2} + \frac{I_{B,mn}}{n_1^2}\right) = \begin{cases} \left(\frac{1}{n_2^2} - \frac{1}{n_1^2}\right)\frac{I_{mn}}{\Lambda_x \Lambda_y}, m, n \neq 0 \\ \left(\frac{1}{n_2^2} - \frac{1}{n_1^2}\right)\frac{A}{\Lambda_x \Lambda_y} + \frac{1}{n_1^2}, m = n = 0 \end{cases} \quad (2b)$$

Here $I_{A,mn}$, $I_{B,mn}$ are Fourier integrals within the pillar and outside the pillar respectively, and A is the area of the trapezoid pillar. For $m \neq 0$ or $n \neq 0$, the Fourier integrals are given by $$I_{A,mn} = \int_{x_-}^{x_+} \exp(-jmK_x x) dx \int_{y_-(x)}^{y_+(x)} \exp(-jnK_y y) dy == I_{mn} \quad (3)$$

$$I_{B,mn} = \quad (4)$$

$$\int_{-\frac{\Lambda_x}{2}}^{\frac{\Lambda_x}{2}} \exp(-jmK_x x) dx \int_{-\frac{\Lambda_y}{2}}^{\frac{\Lambda_y}{2}} \exp(-jnK_y y) dy - I_{mn} == -I_{mn}$$

The problem of calculating $\varepsilon_{mn}$, $a_{mn}$ is reduced to finding the integral $I_{mn}$.

As shown in FIG. 2a, the x dependent borders of the trapezoid are linear functions of x: $y_+(x) = a_+ x + b_+$, $y_-(x) = a_- x + b_-$. For $m \neq 0$, $n \neq 0$, the integral $I_{mn}$, as in Eq. 3 can be analytically integrated to give $$I_{mn} = \frac{j}{nK_y} \int_{x_-}^{x_+} \exp(-jmK_x x)\{\exp[-jnK_y(a_+ x + b_+)] - \quad (5)$$

$$\exp[-jnK_y(a_- x + b_-)]\} dx$$

$$= \frac{\exp(-jnK_y b_-)}{nK_y(mK_x + nK_y a_-)}\{\exp[-j(mK_x + nK_y a_-)x_+] -$$

$$\exp[-j(mK_x + nK_y a_-)x_-]\} - \frac{\exp(-jnK_y b_+)}{nK_y(mK_x + nK_y a_+)}$$

$$\{\exp[-j(mK_x + nK_y a_+)x_+] - \exp[-j(mK_x + nK_y a_+)x_-]\}$$

If m=0 or n=0, it can be written as $$I_{0n} = \frac{\exp(-jnK_yb_-)}{n^2K_y^2a_-}[\exp(-jnK_ya_-x_+) - \exp(-jnK_ya_-x_-)] - \frac{\exp(-jnK_yb_+)}{n^2K_y^2a_+}[\exp(-jnK_ya_+x_+) - \exp(-jnK_ya_+x_-)] \quad (6a)$$

$$I_{m0} = j\frac{(a_+ - a_-)x_+ + b_+ - b_-}{mK_x}[\exp(-jmK_xx_+) - \exp(-jmK_xx_-)] + \frac{a_+ + a_-}{m^2K_x^2}[\exp(-jmK_xx_+) - \exp(-jmK_xx_-)] \quad (6b)$$

Figure 2B:
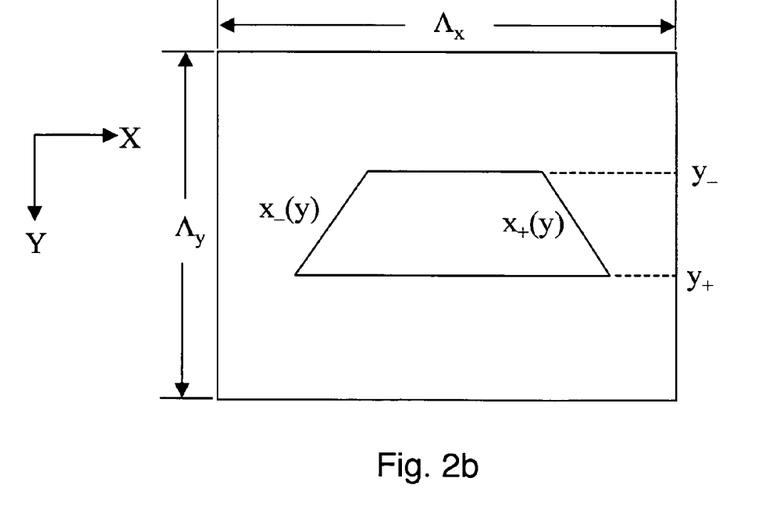

Similarly, a trapezoid having edges parallel to the x axis, as in FIG. 2b can be considered. Here the pillar is in the region $y_- < y < y_+$, $x_-(y) < x < x_+(y)$. Eq. (3) can be re-written as $$I_{mn} = \int_{y_-}^{y_+} \exp(-jnK_yy) dy \int_{x_+(y)}^{x_-(y)} \exp(-jmK_xx) dx. \quad (7)$$

The y dependent sides of the trapezoid of FIG. 2b are linear functions of y: $x_+(y) = a^+y + b^+$, $x_-(y) = a^-y + b^-$. For $m \neq 0$, $n \neq 0$, Eq. 7 can be integrated analytically as $$I_{mn} = \frac{\exp(-jmK_xb^-)}{mK_x(nK_y + mK_xa^-)}\{\exp[-j(nK_y + mK_xa^-)y_+] - \exp[-j(nK_y + mK_xa^-)y_-]\} - \frac{\exp(-jmK_xb^+)}{mK_x(nK_y + mK_xa^+)}\{\exp[-j(nK_y + mK_xa^+)y_+] - \exp[-j(nK_y + mK_xa^+)y_-]\} \quad (8)$$

For m=0, or n=0

$$I_{0n} = \frac{j}{nK_y}\{[(a^+ - a^-)y_+ + b^+ - b^-]\exp(-jnK_yy_+) - [(a^+ - a^-)y_- + b^+ - b^-]\exp(-jnK_yy_+)\} + \frac{a^+ + a^-}{n^2K_y^2}[\exp(-jnK_yy_+) - \exp(-jnK_yy_-)] \quad (9a)$$

$$I_{m0} = \frac{\exp(-jmK_xb^-)}{n^2K_y^2a^-}[\exp(-jmK_xa^-y_+) - \exp(-jmK_xa^-y_-)] - \frac{\exp(-jmK_xb^+)}{m^2K_x^2a^+}[\exp(-jmK_xa^+y_+) - \exp(-jmK_xa^+y_-)] \quad (9b)$$

With these results for $I_{mn}$, the coefficients $\epsilon_{mn}$, $a_{mn}$ for gratings having x-parallel or y-parallel trapezoidal pillars can be determined from Eqs. 2a-4.

As indicated above, gratings having pillars with arbitrary shape can be approximated as gratings having trapezoidal pillars. The trapezoidal pillars can approximate the arbitrary shape of the original pillar. Corresponding to the two cases considered above, providing a trapezoidal tiling of a general pillar shape can entail providing a set of y-parallel trapezoids or a set of x-parallel trapezoids.

Figure 3:
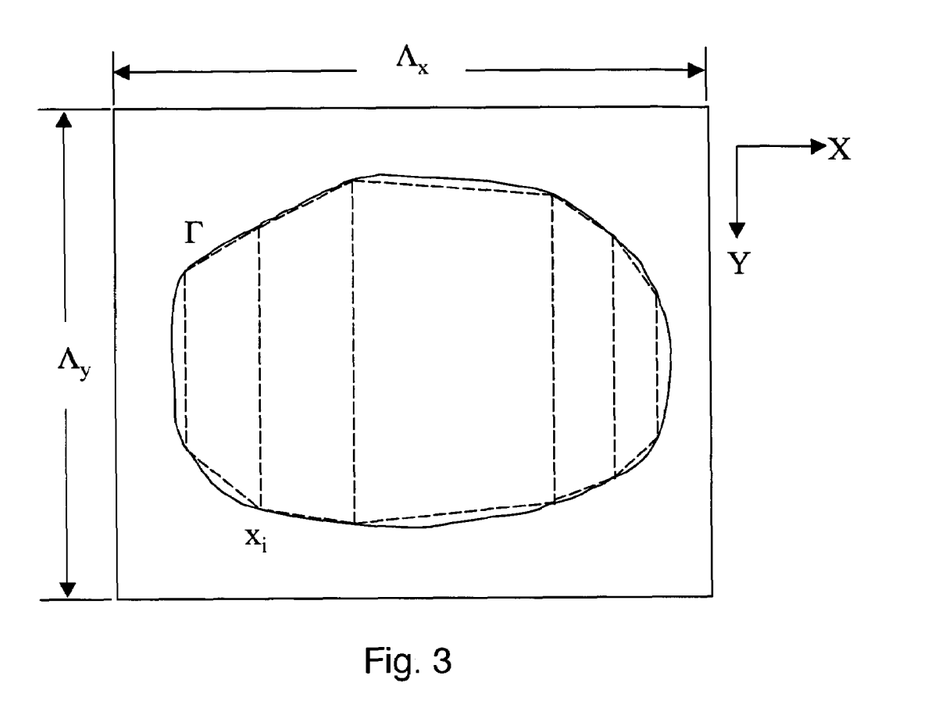
FIG. 3 shows a decomposition of a grating feature into a set of y-axis trapezoids.

FIG. 3 shows y-parallel trapezoids. Here the variable y is first integrated in the 2D integral.

$$I_{mn} = \int_{x_-}^{x_+} \exp(-jmK_xx) \int_{y_-(x)}^{y_+(x)} \exp(-jnK_yy) dy dx \quad (10)$$

Integration in Eq. 10 can be expressed as the combination of several trapezoidal regions with the bases parallel to the y axis. In the sides of the trapezoids, $y_{i+}(x)$ and $y_{i-}(x)$ between the points $x_{i-1}$, and $x_i$ are linear functions of the variable x, as shown in FIG. 3. Then it can be shown as $$I_{mn} = \sum_{i=1}^{N} I_{i,mn} \quad (11)$$

where $I_{i,mn}$ is the analytical result of the integral for the ith trapezoid. For $m \neq 0$ or $n \neq 0$, it is shown (as $I_{mn}$) in Eqs. 5-6, where $x_+$, $x_-$, $a_+$, $a_-$, $b_+$, $b_-$ are given by $x_{i+}$, $x_{i-}$, $a_{i+}$, $a_{i-}$, $b_{i+}$, $b_{i-}$, as determined by the vertex points of the trapezoids, and N is the number of trapezoids constructed by the N+1 points $x_i$ (i=0, 1, 2 ..., N). Here $\epsilon_{mn}$ and $a_{mn}$ can be found from Eq. 2, where the area A is now the total area of all trapezoids.

Figure 4:
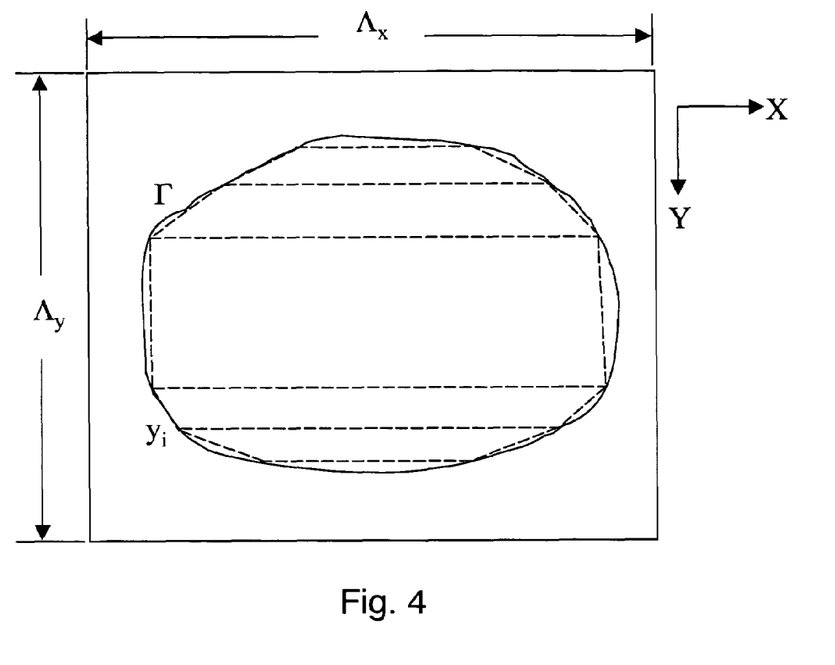
FIG. 4 shows a decomposition of a grating feature into a set of x-axis trapezoids.

FIG. 4 shows x-parallel trapezoids. Here the variable x is integrated first, to express Eq. (10) as $$I_{mn} = \int_{y_-}^{y_+} \exp(-jnK_yy) \int_{x_-(y)}^{x_+(y)} \exp(-jmK_xx) dx = \sum_{i=1}^{N} I_{i,mn} \quad (12)$$

where $I_{i,mn}$ is the analytical result of the integral for the ith trapezoid as shown in Eqs. 8-9. Here $y_+$, $y_-$, $a^+$, $a^-$, $b^+$, $b^-$ are given by $y_{i+}$, $y_{i-}$, $a^{i+}$, $a^{i-}$, $b^{i+}$, $b^{i-}$ as determined by the vertex points of the trapezoids, and N is the number of trapezoids constructed by the N+1 points $y_i$ (i=0, 1, 2 ..., N). Here also, $\epsilon_{mn}$ and $a_{mn}$ can be found from Eq. 2, where the area A is now the total area of all trapezoids.

In this manner, the problem of evaluating a Fourier coefficient of an arbitrary pillar shape is reduced to evaluating a Fourier coefficient of a trapezoidal approximation to the pillar shape, which can be performed analytically.

If the pillars are symmetric about the x axis, it is preferred to employ a set of x-parallel trapezoids where N is even and the trapezoids are symmetrically disposed about the x axis (taken to run through the center of the pillar). Similarly, for pillars which are symmetric about the y axis it is preferred to employ a set of y-parallel trapezoids where N is even and the trapezoids are symmetrically disposed about the y axis (taken to run through the center of the pillar). In either case, the integrals in Eqs. 11 and 12 include equal contributions from symmetrically disposed trapezoids on each side of the relevant symmetry axis. The coefficients $\epsilon_{mn}$ and $a_{mn}$ are then given by $$\varepsilon_{mn} = 2 \frac{n_2^2 - n_1^2}{\Lambda_x \Lambda_y} \sum_{i=1}^{N/2} II_{i,mn} \tag{13a}$$

$$a_{mn} = \left(\frac{1}{n_2^2} - \frac{1}{n_1^2}\right) \frac{2}{\Lambda_x \Lambda_y} \sum_{i=1}^{N/2} II_{i,mn} \tag{13b}$$

Here $II_{i,mn}$ can be found by pairwise summation of the $\pm x_+$ and $\pm x_-$ terms, which gives (from Eqs. 5 and 8):

$$II_{i,mn} = -2j \frac{\exp(-jnK_y b_-)}{nK_y(mK_x + nK_y a_-)}[\sin(mK_x + nK_y a_-)x_+ - \tag{14a}$$

$$\sin(mK_x + nK_y a_-)x_-] +$$

$$2j \frac{\exp(-jnK_y b_+)}{nK_y(mK_x + nK_y a_+)}[\sin(mK_x + nK_y a_+)x_+ - \sin(mK_x + nK_y a_+)x_-]$$

$$II_{i,mn} = -2j \frac{\exp(-jmK_x b^-)}{mK_x(nK_y + mK_x a^-)}[\sin(nK_y + mK_x a^-)y_+ - \tag{14b}$$

$$\sin(nK_y + mK_x a^-)y_-]$$

$$2j \frac{\exp(-jmK_x b^+)}{mK_x(nK_y + mK_x a^+)}[\sin(nK_y + mK_x a^+)y_+ - \sin(nK_y + mK_x a^-)y_-]$$

for the x dependent and y dependent borders respectively. Here computation time is reduced, since N trapezoids are accounted for by N/2 terms in Eqs. 13.

Furthermore, if the pillars are symmetric with respect to both the x and y axes, the integration $I_{i,mn}$ in Eq. 13 will be symmetric in both x and y, and it can be expressed as twice of the integration in half region, as in Eqs. 5-6 (or Eqs. 8-9 for the X-Y expression). In this case, the calculation will be even faster.

Various approaches can be employed to provide trapezoidal tilings of pillars having a more general shape. Inscribed tilings, equal area tilings, and tilings based on a line simplification algorithm have been considered.

In inscribed tilings, the trapezoids are inscribed within the border of the pillar. The position of the N points $x_i$ (or $y_i$) can be found by the following process. At first, the number of trapezoids N is selected by the user (according to the required precision) with equal steps $x_i$ (i=0, 1 . . . N), and then the two $y_i(x)$ (top and bottom borders of the pillar) for each trapezoid are calculated. The area error of each trapezoid can be found. The total area error is the sum of the errors for each trapezoid, since inscribed trapezoids can only be "too small" (as seen on FIGS. 3 and 4). The distribution of $x_i$ can be improved as follows. Select the trapezoid having largest area error (let this trapezoid be trapezoid k). Increase $x_{k-1}$ and decrease $x_k$, equally, until a local minimum of total area error vs. trapezoid adjustment is reached. Repeat the trapezoid selection and adjusting process until no further improvement in total area error is obtained. In practice, this method is preferably performed automatically by a suitably programmed computer or processor. Once the number and shape of the trapezoids are set, the Fourier coefficients $\epsilon_{mn}$ and $a_{mn}$ can be calculated from Eqs. 2, 5-6 (or Eqs. 2, 8-9). Increasing N will improve accuracy.

Figure 5:
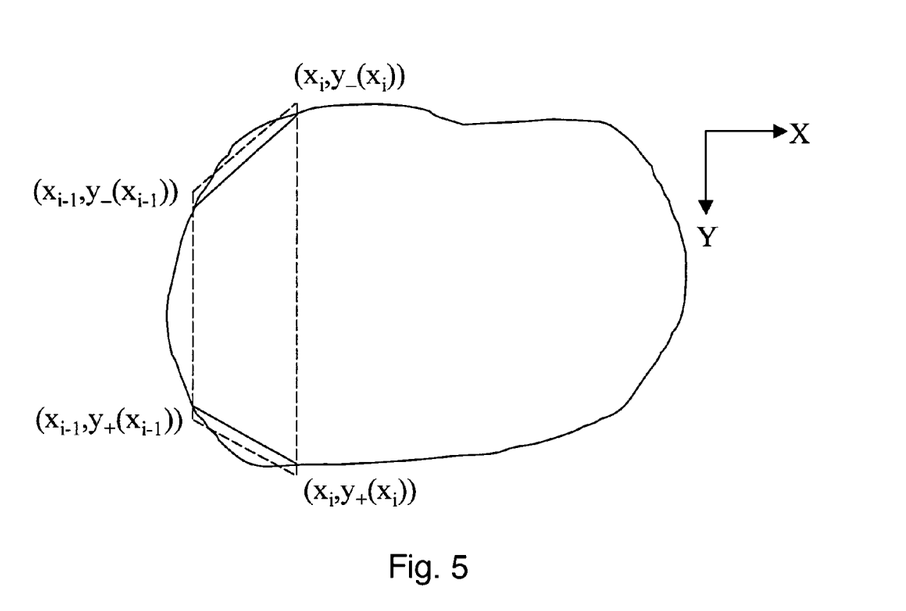
FIG. 5 shows a y-axis trapezoid selected to have area equal to the corresponding segment of a grating feature.

Equal area tilings can be derived from inscribed tilings as shown on FIG. 5. At first, the number of trapezoids N is selected by the user (according to the required precision) with equal steps $x_i$ (i=0, 1 . . . N), and then the two $y_i$ for each trapezoid are calculated. Here the $y_i(x)$ are obtained by starting with the $y_i(x)$ obtained from an inscribed tiling (solid lines on FIG. 5) and shifting these linear functions vertically so that each trapezoid has area equal to the corresponding "strip" of the pillar. The equal area $y_i(x)$ (dashed lines on FIG. 5) are parallel to the corresponding inscribed $y_i(x)$. The total error in this case is defined by $$S = \sum_{i=1}^{N} \max \left| y - \frac{y_i - y_{i-1}}{x_i - x_{i-1}} x \right|, (x_{i-1} < x < x_i).$$

The area error is zero by construction for this case.

The distribution of $x_i$ can be improved as follows. Select the trapezoid having largest contribution to S (let this trapezoid be trapezoid k). Increase $x_{k-1}$ and decrease $x_k$ until S reaches a local minimum with respect to trapezoid adjustment. Repeat the selection and adjusting until S cannot be decreased any more. This method is also preferably implemented by a suitably programmed computer or processor. When the number, position and shape of all trapezoids are set, the Fourier coefficients $\epsilon_{mn}$ and $a_{mn}$ can be calculated from Eqs. 2, 5-6 (or Eqs. 2, 8-9). Increasing N increases accuracy.

Another approach for generating trapezoidal tilings is to employ a line simplification algorithm. In particular, let a pillar be defined by a general curve Γ. Line simplification algorithms (e.g., the Douglas-Peucker Line-Simplification Algorithm) provide an approximation to Γ with a set of connected line segments, e.g., as described in "Speeding up the Douglas-Peucker Line-Simplification Algorithm" by John Hershberger and Jack Snoeyink, in Proc. 5th Intl. Symp. Spatial Data Handling, IGU Commission on GIS, pages 134-143, 1992. In this approach, a maximum error in y (or x for trapezoids parallel to x) Δ is set by the user at first, and a small number(N=2 or 3) of vertex points $x_i$, $y_i$ with equal separation of x is set at the beginning of the process. Then errors $$\Delta_i(x) = \left| y - \frac{y_i - y_{i-1}}{x_i - x_{i-1}} x \right|, (x_{i-1} < x < x_i)$$

are calculated. If the largest error of the $\Delta_i(x)$ is larger than Δ, split the corresponding segment into two with the new vertex point (i.e., new $x_i$) set at the largest error point. This process can be continued until sufficient accuracy is obtained. Each new $x_i$ will typically provide two new trapezoid vertices, corresponding to $y_-(x_i)$ and $y_+(x_i)$.

There are different advantages for the above three approaches. The first two approaches provide a very good convergence rate, which can be beneficial for complicated pillar shapes. However, determining the vertex points of the trapezoids can be complicated, especially for the second approach (i.e., equal area). The line-simplification approach provides a powerful and general way to select the trapezoids, in which a precision can be set by the user as opposed to setting the number of trapezoids in advance. Although the preceding examples considered y-parallel trapezoids (e.g., as in FIG. 3), all three methods are equally applicable to x-parallel trapezoids (e.g., as in FIG. 4).

The invention is also applicable in cases where a grating unit cell includes more than one pillar. For example, a unit cell having several pillars each with index $n_2$ leads to the following generalization of Eq. 3

$$I_{1,mn} = \sum_{j=1}^{p}\left[\int_{x_{j-}}^{x_{j+}}\exp(-jmK_x x)dx\int_{y_{j-}(x)}^{y_{j+}(x)}\exp(-jnK_y y)dy\right] == I_{mn}, \quad (15)$$

where p is the number of pillars in the unit cell. For each pillar j, the integral can be found as described above (i.e., each pillar can be separately approximated by a trapezoidal tiling). Then the Fourier coefficients of relative permittivity and inverse permittivity can be found by adding the contributions of each pillar.

The case where multiple pillars have the same shape and orientation is important in engineering practice. For example, suppose two such pillars are present. For this case, Eq. 15 gives $$I_{1,mn} = \int_{x_{1-}}^{x_{1+}}\exp(-jmK_x x)dx\int_{y_{1-}}^{y_{1+}}\exp(-jnK_y y)dy + \int_{x_{2-}}^{x_{2+}}\exp(-jmK_x x)dx\int_{y_{2-}}^{y_{2+}}\exp(-jnK_y y)dy \quad (16)$$

We assume pillar 2 is offset from pillar 1 by an offset $(D_x, D_y)$, which gives $x_{2-}=x_{1-}+D_x$, $x_{2+}=x_{1+}+D_x$, $y_{2-}=y_{1-}+D_y$, $y_{2+}=y_{1+}+D_y$ in Eq. 16. Simplification of Eq. 16 gives $$I_{1,mn} = \left\{1+\exp\left[-j2\pi\left(\frac{mD_x}{\Lambda_x}+\frac{nD_y}{\Lambda_y}\right)\right]\right\}\int_{x_{1-}}^{x_{1+}}\exp(-jmK_x x)dx\int_{y_{1-}}^{y_{1+}}\exp(-jnK_y y)dy. \quad (17)$$

Thus calculations only need to be performed for one of the pillars since contributions of other pillars having the same shape can be accounted for with an appropriate phase-shift. This phase shift approach is applicable to any number of pillars having the same shape and orientation.

The preceding description has considered gratings having orthogonal unit cells (i.e., unit cells which are rectangular or square). If a grating has an orthogonal lattice (i.e., the lattice translation vectors defining the lattice periodicity are orthogonal), the lattice primitive unit cell is orthogonal, and the preceding description is directly applicable to the primitive grating unit cell. Here a primitive unit cell is a cell having minimal area that can be repeated to form the grating. Gratings can also have non-orthogonal lattices (e.g., a hexagonal lattice), as shown on FIG. 6.

Figure 6:
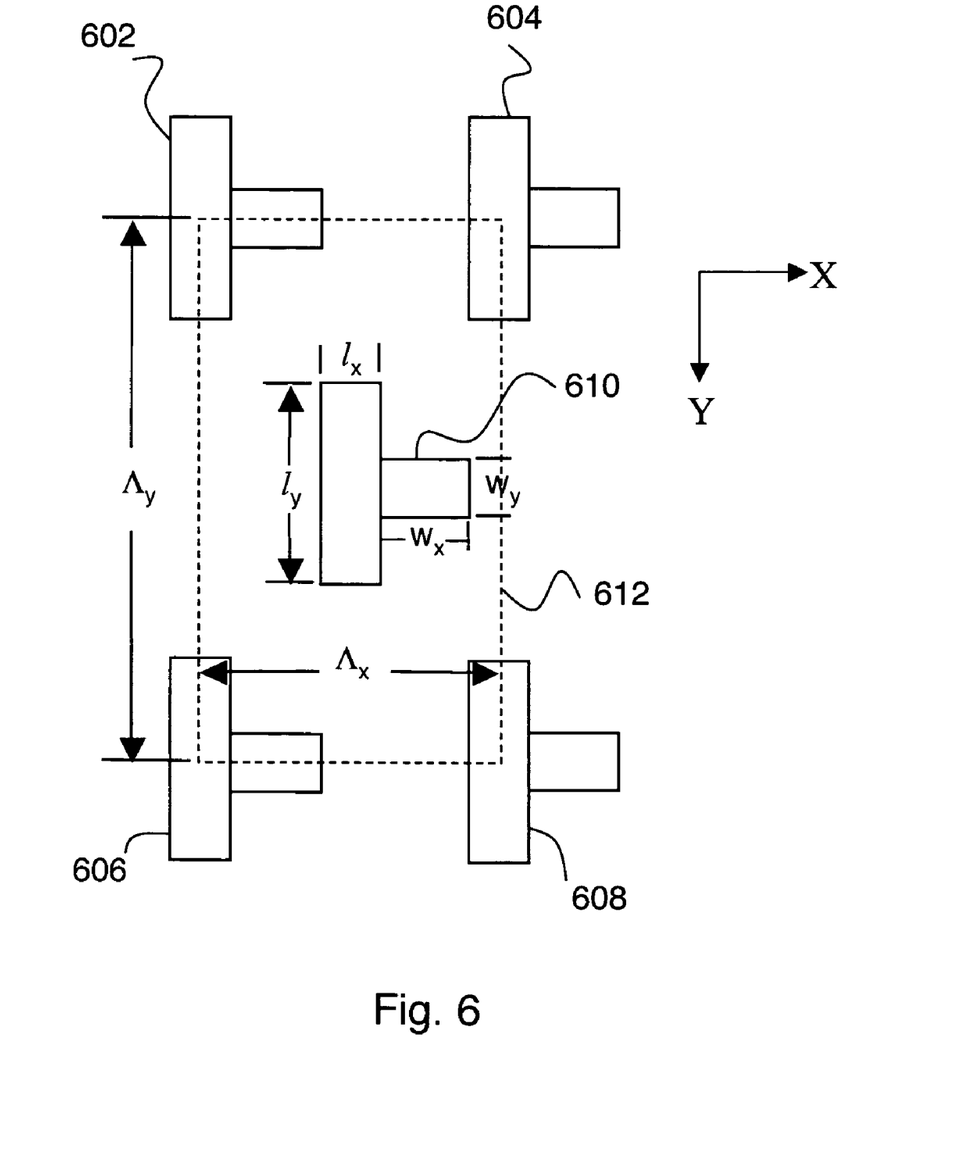
FIG. 6 is a top view of grating having T-shaped features disposed on a non-rectangular lattice.

Grating diffraction calculations can be reformulated to accommodate non-orthogonal gratings, e.g., as considered by Lifeng Li, J. Opt. Soc. Am. A/vol. 14, no. 10, 2758-2767, 1997. In practicing the invention for non-orthogonal gratings, an alternative approach is preferred. More specifically, a non-primitive orthogonal unit cell is selected for the grating. Computations can then proceed as described above. In the example of FIG. 6, the non-primitive orthogonal unit cell is shown as 612. Cell 612 includes all of pillar 610, and parts of pillars 602, 604, 606, and 608. Effectively, cell 612 includes two instances of the T-shaped pillar. In contrast, a primitive unit cell for the example of FIG. 6 would include only one instance of the T-shaped pillar, but since the primitive cell is hexagonal, computations in terms of the primitive unit cell would be more complicated. Here a non-primitive unit cell is a cell having larger area than primitive unit cell that can also be repeated to form the grating.

The T-shaped pillar is modeled as two rectangles (which is a special case of the trapezoidal decomposition described above). The integral of pillar 610 located in the center of cell 612 is given by $$I_{10,mn} = \int_{-\frac{l_x}{2}}^{\frac{l_x}{2}}\exp(-jmK_x x)dx\int_{-\frac{l_y}{2}}^{\frac{l_y}{2}}\exp(-jnK_y y)dy + \int_{\frac{l_x}{2}}^{\frac{l_x}{2}+w_x}\exp(-jmK_x x)dx\int_{-\frac{w_y}{2}}^{\frac{w_y}{2}}\exp(-jnK_y y)dy \quad (18)$$

The integral of the second pillar can be related to the result of Eq. 18 by a phase shift of $\exp[-j(mK_x\Delta x+nK_y\Delta y)]$. The pieces of pillars 602, 604, 606, and 608 located in the four corners of unit cell 612 act as a single pillar laterally shifted from pillar 610 by $(\Lambda_x/2, \Lambda_y/2)$. From Eq. 17, the whole integral in a unit cell can be written as $$I_{l,mn} = [1+(-1)^{m+n}]\cdot I_{10,mn} \quad (19)$$

For $m\neq 0$ or $n\neq 0$, evaluation of Eq. 18 gives $$I_{10,mn} = \frac{\Lambda_x\Lambda_y}{mn\pi}\left\{\sin\left(m\pi\frac{l_x}{\Lambda_x}\right)\sin\left(n\pi\frac{l_y}{\Lambda_y}\right) + \exp\left[-jm\pi\left(\frac{l_x}{\Lambda_x}+w_x\right)\right]\sin\left(m\pi\frac{w_x}{\Lambda_x}\right)\sin\left(n\pi\frac{w_y}{\Lambda_y}\right)\right\} \quad (20)$$

For odd m+n, $I_{1,mn}=0$, and for even m+n, $I_{1,mn}=2I_{10,mn}$ and $I_{2,mn}=-I_{1,mn}$ for a binary grating. Combining results, the permittivity Fourier coefficients are given by $$\varepsilon_{mn} = \frac{1}{\Lambda_x\Lambda_y}(n_2^2\cdot I_{1,mn}+n_1^2\cdot I_{2,mn}) = \frac{n_2^2-n_1^2}{\Lambda_x\Lambda_y}I_{1,mn} \quad (21)$$
$$= \frac{2(n_2^2-n_1^2)}{mn\pi}\left\{\sin\left(m\pi\frac{l_x}{\Lambda_x}\right)\sin\left(n\pi\frac{l_y}{\Lambda_y}\right) + \exp\left[-jm\pi\left(\frac{l_x}{\Lambda_x}+w_x\right)\right]\sin\left(m\pi\frac{w_x}{\Lambda_x}\right)\sin\left(n\pi\frac{w_y}{\Lambda_y}\right)\right\}$$

for even m+n, and $\varepsilon_{mn}=0$ for odd m+n. The $a_{mn}$ can be found similarly. For m=n=0, $\varepsilon_{mn}$, $a_{mn}$ can be found from Eq. 2 with A replaced by the total area of all pillars in an unit cell.

Figure 7:
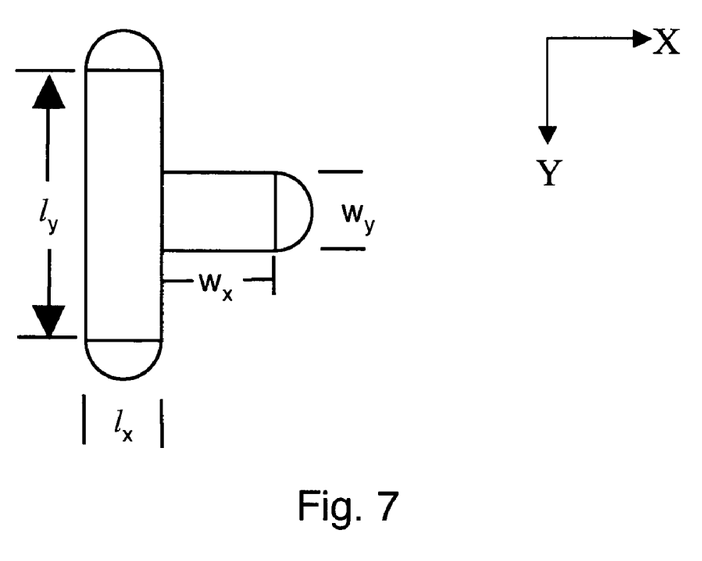
FIG. 7 shows a T-shaped grating feature having rounded ends.

FIG. 7 shows a T-shape pillar having rounded ends. The following description is an example of how Fourier coefficients of a non-orthogonal grating (as in FIG. 6) having the pillars of FIG. 7 can be obtained in accordance with principles of the invention. The unit cell geometry is as on FIG. 6 (i.e., cell dimensions are $\Lambda_x$, $\Lambda_y$ in x, y directions respectively). The radii of the half circles at the end of the T-shape of FIG. 7 are $r_x = l_x/2$, and $r_y = w_y/2$ as shown. Eq. 18 gives $$I_{10,mn} = \int_{-\frac{l_x}{2}}^{\frac{l_x}{2}} \exp(-jmK_x x)dx \int_{-\sqrt{r_x^2-x^2}-\frac{l_y}{2}}^{\sqrt{r_x^2-x^2}+\frac{l_y}{2}} \exp(-jnK_y y)dy + \int_{\frac{l_x}{2}}^{\frac{l_x}{2}+w_x+\sqrt{r_y^2-y^2}} \exp(-jmK_x x)dx \int_{-\frac{w_y}{2}}^{\frac{w_y}{2}} \exp(-jnK_y y)dy \quad (22)$$

which can further be written as $$I_{10,mn} = \int_{-\frac{l_x}{2}}^{\frac{l_x}{2}} \cos(mK_x x) \int_{-\frac{l_y}{2}}^{\frac{l_y}{2}} \cos(nK_y y) \, dy \, dx + \\ 2\int_{\frac{l_y}{2}}^{\frac{l_y}{2}+r_x} \cos(nK_y y) \int_{-\sqrt{r_x^2-y^2}}^{\sqrt{r_x^2-y^2}} \cos(mK_x x) \, dx \, dy + \\ \int_{-\frac{w_y}{2}}^{\frac{w_y}{2}} \cos(nK_y y) \, dy \int_{\frac{l_x}{2}}^{\frac{l_x}{2}+w_x} \exp(-jmK_x x) \, dx + \\ \int_{r_x+w_x}^{r_x+w_x+r_y} \exp(-jmK_x x) \int_{-\sqrt{r_y^2-x^2}}^{\sqrt{r_y^2-x^2}} \cos(nK_y y) \, dy \, dx \quad (23)$$

Here the first and third integrals are analytically integrable. The second and fourth integrals can be approximated as described above with y-parallel and x-parallel trapezoids respectively.

For $m \ne 0$, $n \ne 0$, a number of trapezoids N can be selected to determine $x_i$, $y_i$ in the second and fourth integrals in Eq. 23. From Eqs. 5-6, 8-9, Eq. 23 can be re-written as $$I_{10,mn} = I_{0,mn} + \\ \frac{2\Lambda_x}{m\pi} \sum_{i=1}^{N'} \int_{y_{i-1}}^{y_i} \cos(nK_y y) \sin\left\{mK_x\left[k_{yi}(y-y_i) + \sqrt{r^2-y_i^2}\right]\right\} dy + \\ \frac{\Lambda_y}{n\pi} \sum_{i=1}^{N} \int_{x_{i-1}}^{x_i} \exp(-jmK_x x) \sin\left\{nK_y\left[k_{xi}(x-x_i) + \sqrt{r^2-x_i^2}\right]\right\} dx \quad (24)$$

where $$k_{xi} = \frac{\sqrt{r^2-x_i^2} - \sqrt{r^2-x_{i-1}^2}}{x_i - x_{i-1}}, \quad k_{yi} = \frac{\sqrt{r^2-y_i^2} - \sqrt{r^2-y_{i-1}^2}}{y_i - y_{i-1}}. \quad (25)$$

Here $$I_{0,mn} = \frac{\Lambda_x \Lambda_y}{mn\pi^2}\left[\sin\left(m\pi\frac{l_x}{\Lambda_x}\right)\sin\left(n\pi\frac{l_y}{\Lambda_y}\right) + \exp\left[-j(l_x+w_x)\frac{m\pi}{\Lambda_x}\right]\sin\left(m\pi\frac{w_x}{\Lambda_x}\right)\sin\left(n\pi\frac{w_y}{\Lambda_y}\right)\right] \quad (26)$$

is the sum of the first and third integrals in Eq. 23. Eq. (24) can further be integrated as $$I_{10,mn} = I_{0,mn} - \frac{\Lambda_x}{m\pi} I_{a,mn} - \frac{\Lambda_y}{n\pi} I_{b,mn} \quad (27)$$

where $$I_{a,mn} = \sum_{i=1}^{N} \left\{ \frac{\cos[(mK_x k_{yi} + nK_y)y + C_m]}{mK_x k_{yi} + nK_y} + \frac{\cos[(mK_x k_{yi} - nK_y)y + C_m]}{mK_x k_{yi} - nK_y} \right\}\Bigg|_{y_{i-1}}^{y_i} \quad (28a)$$

$$I_{b,mn} = \sum_{i=1}^{N} \left\{ \frac{\exp(-jmK_x x)}{(nK_y k_{xi})^2 - m^2 K_x^2}\left[j\frac{m\Lambda_y}{n\Lambda_x k_{xi}}\sin(nK_x k_{xi} x + C_n) + \cos(nK_x k_{xi} + C_n)\right] \right\}\Bigg|_{x_{i-1}}^{x_i} \quad (28b)$$

and $$C_m = -mK_x k_{yi} y_i + \sqrt{r^2 - y_i^2}, \quad C_n = -nK_y k_{xi} x_i + \sqrt{r^2 - x_i^2}. \quad (29)$$

If $(mK_x k_{yi})^2 = (nK_y)^2$ in any one of the trapezoids, the corresponding term in $I_{a,mn}$ in Eq. 28a can be written as $$I_{a,mn} = \begin{cases} \left[\frac{\cos(2nK_y y + C_m)}{2nK_y} - y\sin C_m\right]\Big|_{y_{i-1}}^{y_i}, & mK_x k_{yi} = nK_y \\ -\left[y\sin C_m + \frac{\cos(C_m - 2nK_y y)}{2nK_y}\right]\Big|_{y_{i-1}}^{y_i}, & mK_x k_{yi} = -nK_y \end{cases} \quad (30)$$

Similarly, if $(nK_y k_{xi})^2 = (mK_x)^2$ in any one of the trapezoids, the corresponding term in $I_{b,mn}$ in Eq. 28b can be written as $$I_{b,mn} = \left[-j\frac{mK_x x + C_n}{2mK_x}\exp(iC_n) - \frac{\exp[-j(2mK_x x - C_n)]}{4mK_x}\right]\Bigg|_{x_{i-1}}^{x_i} \quad (31)$$

From Eqs. 2-4, and 19, we have, for m or $n \ne 0$, $$\varepsilon_{mn} = \frac{n_2^2 - n_1^2}{\Lambda_x \Lambda_y} I_{1,mn} = \begin{cases} 0, & m+n = 2k-1, \ k = 1, 2, 3 \ldots \\ 2\frac{n_2^2 - n_1^2}{\Lambda_x \Lambda_y} I_{10,mn}, & m+n = 2k, \ k = 1, 2, 3 \ldots \end{cases} \quad (32a)$$

$$a_{mn} = \left(\frac{1}{n_2^2} - \frac{1}{n_1^2}\right)\frac{I_{1,mn}}{\Lambda_x \Lambda_y} = \\ \begin{cases} 0, & m+n = 2k-1, \ k = 1, 2, 3 \ldots \\ \left(\frac{1}{n_2^2} - \frac{1}{n_1^2}\right)\frac{2I_{10,mn}}{\Lambda_x \Lambda_y}, & m+n = 2k, \ k = 1, 2, 3 \ldots \end{cases} \quad (32b)$$

where $I_{10,mn}$ can be found from Eqs. 27-31.

For m=n=0, Eq. 22 gives $$I_{10,00} = \int_{-\frac{l_x}{2}}^{\frac{l_x}{2}} \left(2\sqrt{r_x^2 - x^2} + l_y\right)dx + \int_{-\frac{w_y}{2}}^{\frac{w_y}{2}} \left(w_x + \sqrt{r_y^2 - y^2}\right)dy \quad (33)$$

$$= l_x l_y + w_x w_y + \frac{\pi}{2}(2r_x^2 + r_y^2)$$

and from Eq. 2, the coefficients are given by $$\varepsilon_{00} = 2\frac{n_2^2 - n_1^2}{\Lambda_x \Lambda_y}\left[l_x l_y + w_x w_y + \frac{\pi}{2}(2r_x^2 + r_y^2)\right] + n_1^2 \quad (34a)$$

$$a_{00} = \left(\frac{1}{n_2^2} - \frac{1}{n_1^2}\right)\frac{2}{\Lambda_x \Lambda_y}\left[l_x l_y + w_x w_y + \frac{\pi}{2}(2r_x^2 + r_y^2)\right] + \frac{1}{n_1^2} \quad (34b)$$

For m=0, Eq. 23 gives $$I_{10,0n} = \frac{\Lambda_y}{n\pi}\left(l_x \sin\frac{n\pi l_y}{\Lambda_y} + w_x \sin\frac{n\pi w_y}{\Lambda_y}\right) + \quad (35)$$

$$4\sum_{i=1}^{N}\int_{y_{i-1}}^{y_i} \cos(nK_y y)\left[k_{yi}(y - y_i) + \sqrt{r_x^2 - y_i^2}\right]dy +$$

$$\frac{\Lambda_y}{n\pi}\sum_{i=1}^{N}\int_{x_{i-1}}^{x_i} \sin\left\{nK_y\left[k_{xi}(x - x_i) + \sqrt{r_x^2 - x_i^2}\right]\right\}dx$$

which can be further integrated as $$I_{10,0n} = \frac{\Lambda_y}{n\pi}\left(l_x \sin\frac{n\pi l_y}{\Lambda_y} + w_x \sin\frac{n\pi w_y}{\Lambda_y}\right) + \quad (36)$$

$$\frac{2\Lambda_y}{n\pi}\sum_{i=1}^{N}\left[(k_{yi}y + C_{0n})\sin(nK_y y) - \frac{\Lambda_y k_{yi}}{2n\pi}\cos(nK_y y)\right]\Big|_{y_{i-1}}^{y_i}$$

$$+ \frac{\Lambda_y^2}{2n^2\pi^2}\sum_{i=1}^{N} k_{xi}\cos\left\{nK_y\left[k_{xi}(x - x_i) + \sqrt{r_x^2 - x_i^2}\right]\right\}\Big|_{x_{i-1}}^{x_i}$$

where $$C_{0n} = -k_{yi} y_i + \sqrt{r^2 - y_i^2} \quad (37)$$

The coefficients $\epsilon_{0n}$, $a_{0n}$ can then be found from Eq. 32 by setting m=0.

For n=0, Eq. 23 gives $$I_{10,m0} = \quad (38)$$

$$I_{0,m0} + \frac{2\Lambda_x}{m\pi}\sum_{i=1}^{N}\int_{y_{i-1}}^{y_i} \sin\left\{mK_x\left[k_{yi}(y - y_i) + \sqrt{r^2 - y_i^2}\right]\right\}dy +$$

$$2\sum_{i=1}^{N}\int_{x_{i-1}}^{x_i} \exp(-jmK_x x)\left[k_{xi}(x - x_i) + \sqrt{r^2 - x_i^2}\right]dx$$

where $$I_{0,m0} = \frac{\Lambda_x}{m\pi}\left\{l_y \sin\frac{m\pi l_x}{\Lambda_x} + w_y \exp\left[-j(l_x + w_y)\frac{m\pi}{\Lambda_x}\right]\sin\frac{m\pi w_y}{\Lambda_y}\right\}. \quad (39)$$

Eq. 38 can further be integrated as $$I_{10,mn} = \quad (40)$$

$$I_{0,m0} - \frac{\Lambda_x^2}{m^2\pi^2}\sum_{i=1}^{N} k_{yi}\cos\left\{mK_x\left[k_{yi}(y - y_i) + \sqrt{r^2 - y_i^2}\right]\right\}\Big|_{y_{i-1}}^{y_i}$$

$$+ \frac{j\Lambda_x}{m\pi}\sum_{i=1}^{N}\left\{\left[k_{xi}(x - x_i) + \sqrt{r^2 - x_i^2}\right]\exp(-jmK_x x) - \frac{j\Lambda_x k_{xi}}{2m\pi}\exp(-jmK_x x)\right\}\Big|_{x_{i-1}}^{x_i}$$

The coefficients $\epsilon_{m0}$, $a_{m0}$ can then be found from Eq. 32 by setting n=0.

The preceding description shows how the Fourier coefficients $\epsilon_{mn}$, $a_{mn}$ can be obtained in this example (i.e., from Eqs. 27-31, 34, 35-37, and 38-40, in combination with Eq. 32). Once the Fourier coefficients are available, RCWA diffraction calculations can be performed (e.g., to calculate reflectance as a function of wavelength for comparison to a measured spectral reflectance).

As indicated above, when the invention is applied to a grating having a non-orthogonal lattice, an orthogonal non-primitive unit cell is employed for the calculations. Such a non-primitive unit cell is larger than a primitive unit cell. More specifically, a non-primitive unit cell has an area which is an integer multiple (2 or more) of the unit cell area. In the example of FIGS. 6 and 7, the orthogonal unit cell employed has twice the area of the primitive unit cell. However, increasing the unit cell area leads to increased computation time in an RCWA, since the number of diffraction orders that must be retained for a given level of accuracy tends to be proportional to unit cell area.

Thus in cases where the grating has a reflection symmetry plane, it is particularly preferred to illuminate the grating such that the plane of incidence (e.g., 110 on FIG. 1) is parallel to or coincides with the grating symmetry plane, as shown on FIG. 1. In such cases, a symmetry-reduced 2-D RCWA calculation can be employed, as described in U.S. patent application Ser. No. 11/305,449 by the present inventors. Such symmetry reduction is especially beneficial in connection with gratings having non-orthogonal lattices, since the undesirable effect of increasing unit cell area can be compensated for.

Figure 8:
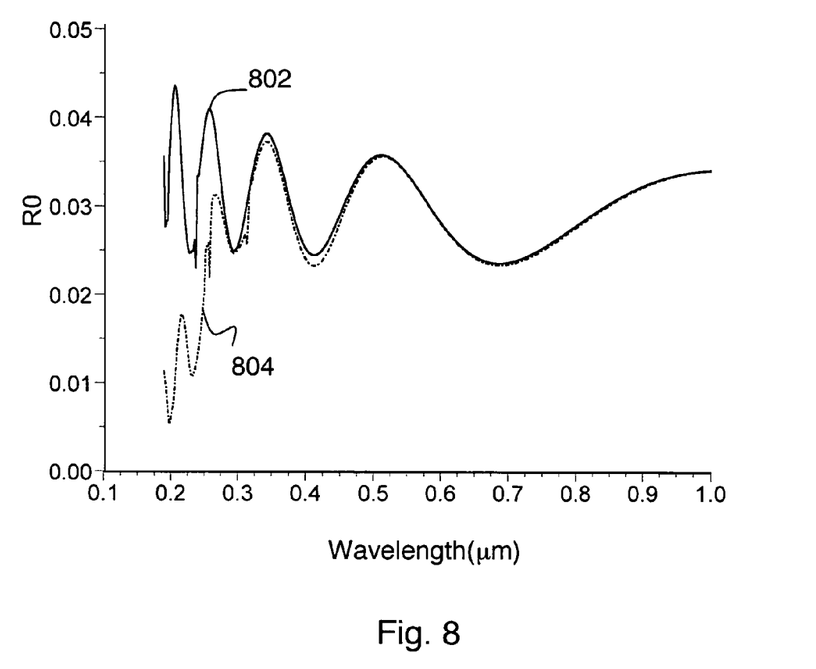
FIG. 8 shows exemplary grating reflectance calculation results in accordance with embodiments of the invention.

FIG. 8 shows calculated reflectance results from examples of the invention. Curve 802 (solid line) shows calculated zero-order reflectance for a grating having the T-shaped pillars of FIG. 7 and the non-orthogonal lattice of FIG. 6. Grating Fourier coefficients are obtained as described above. The plane of incidence is the x-z plane (as on FIG. 1), with an angle of incidence of 9 degrees. The grating is an $SiO_2$/air grating on a quartz substrate having $\Lambda_x = \Lambda_y = 0.4$ μm, d=0.5 μm, $l_y = 0.4\Lambda_y$, $w_x = 0.2\Lambda_x$, $r_x = r_y = 0.1\Lambda_x$. Identical results for this grating were obtained with a symmetry-reduced RCWA calculation as described above and with a conventional RCWA calculation.

Curve 804 (dashed line) on FIG. 8 shows calculated reflectance for a grating having circular pillars. The grating and illumination parameters are as described above for curve 802, except that $w_x$, $w_y$ and $l_y$ are all set to zero, which changes the T-shaped features to circular features. Grating Fourier coefficients are obtained as described above. The diffraction problem for curve 804 is equivalent (i.e., has the same reflectance spectrum) to an $SiO_2$/air grating on a quartz substrate having $\Lambda_x=\Lambda_y=0.2828$ μm and $r_x=r_y=0.141\Lambda_x$ with one circular pillar per unit cell that is illuminated at 45 degree conical incidence. This equivalence has been verified by explicit calculations for both cases. The computation time for the large unit cell case is about 60% of the computation time for the equivalent conical incidence case, since the grating is symmetric allowing the use of a symmetry reduced RCWA having reduced matrix size.

The invention claimed is:

1. A method for estimating a Fourier coefficient of a function f(x,y) within a two-dimensional domain D, the method comprising:
   a) providing an approximate tiling of the domain D with N regions $R_j$ indexed by j ($1 \leq j \leq N$), wherein each of regions $R_j$ has a trapezoidal shape;
   b) providing a constant approximation $f_j$ to f(x,y) in each region $R_j$;
   c) evaluating a Fourier integral of $f_j$ over each of the regions $R_j$ to provide regional coefficients $F_j$;
   d) providing F as an estimate of the Fourier coefficient of f(x,y) in D, where F is the sum of the regional coefficients $F_j$.

2. The method of claim 1, wherein said regional coefficients $F_j$ are evaluated analytically.

3. The method of claim 1, wherein f(x,y) is symmetric with respect to the x axis, and wherein said approximate tiling is selected to be symmetric with respect to the x axis, whereby computation time is reduced.

4. The method of claim 1, wherein f(x,y) is symmetric with respect to the y axis, and wherein said approximate tiling is selected to be symmetric with respect to the y axis, whereby computation time is reduced.

5. The method of claim 1, wherein f(x,y) is symmetric with respect to the x axis and with respect to the y axis, and wherein said approximate tiling is selected to be symmetric with respect to the x axis and to the y axis, whereby computation time is reduced.

6. The method of claim 1, wherein said regions $R_j$ are inscribed within said domain D.

7. The method of claim 1, wherein said regions $R_j$ have the same total area as said domain D.

8. The method of claim 1, wherein said approximate tiling is based on an approximation of a boundary of said domain D with a connected set of line segments.

9. The method of claim 8, wherein said approximation of a boundary of said domain D with a connected set of line segments is provided by the Douglas-Peucker line simplification algorithm.

10. The method of claim 1, wherein a function g(x,y)=f(x,y) in said domain D, wherein $g(x+\Delta x,y+\Delta y)=f(x,y)$ for an offset $(\Delta x,\Delta y)$, and further comprising providing a Fourier coefficient G of g(x,y) where G is the sum of F and F times an offset phase shift.

11. A system for optically determining one or more parameters of a 2-D grating, the system comprising:
   a) an optical source providing optical radiation at a variable wavelength and illuminating said 2-D grating;
   b) an optical detector receiving radiation from said 2-D grating and providing a measured spectral response; and
   c) a processor receiving said measured spectral response and providing a modeled spectral response of said 2-D grating having said parameters as variables, wherein said processor determines said one or more parameters by adjusting said variables to fit said modeled spectral response to said measured spectral response;
   wherein said modeled spectral response is obtained by a computation including evaluating grating Fourier coefficients according to
   a method for estimating a Fourier coefficient of a function f(x,y) within a two-dimensional domain D, the method comprising:
   a) providing an approximate tiling of the domain D with N regions $R_j$ indexed by j ($1 \leq j \leq N$), wherein each of regions $R_j$ has a trapezoidal shape;
   b) providing a constant approximation $f_j$ to f(x,y) in each region $R_j$;
   c) evaluating a Fourier integral of $f_j$ over each of the regions $R_j$ to provide regional coefficients $F_j$;
   d) providing F as an estimate of the Fourier coefficient of f(x,y) in D, where F is the sum of the regional coefficients $F_j$.

12. The system of claim 11, wherein said grating Fourier coefficients are selected from the group consisting of Fourier coefficients of grating permittivity, Fourier coefficients of grating inverse permittivity, and combinations thereof.

13. The system of claim 11,
   wherein said grating has substantial reflection symmetry in a grating reflection plane;
   wherein said radiation has a wave vector in said grating reflection plane;
   and wherein said computation includes a rigorous coupled wave analysis having a symmetry reduced number of diffraction orders.

14. The system of claim 11, wherein said grating has a non-rectangular primitive lattice, and wherein a non-primitive unit cell of said grating includes said domain D and another domain D' having the same shape and orientation as D.

15. A system for optically determining one or more parameters of a 2-D grating, the system comprising:
   a) an optical source providing optical radiation at a variable angle of incidence and illuminating said 2-D grating;
   b) an optical detector receiving radiation from said 2-D grating and providing a measured angular response; and
   c) a processor receiving said measured angular response and providing a modeled angular response of said 2-D grating having said parameters as variables, wherein said processor determines said one or more parameters by adjusting said variables to fit said modeled angular response to said measured angular response;
   wherein said modeled angular response is obtained by a computation including evaluating grating Fourier coefficients according to
   a method for estimating a Fourier coefficient of a function f(x,y) within a two-dimensional domain D, the method comprising:
   a) providing an approximate tiling of the domain D with N regions $R_j$ indexed by j ($1 \leq j \leq N$), wherein each of regions $R_j$ has a trapezoidal shape;
   b) providing a constant approximation $f_j$ to f(x,y) in each region $R_j$;
   c) evaluating a Fourier integral of $f_j$ over each of the regions $R_j$ to provide regional coefficients $F_j$;
   d) providing F as an estimate of the Fourier coefficient of f(x,y) in D, where F is the sum of the regional coefficients $F_j$.

16. The system of claim 15, wherein said grating Fourier coefficients are selected from the group consisting of Fourier coefficients of grating permittivity, Fourier coefficients of grating inverse permittivity, and combinations thereof.

17. The system of claim 15,
wherein said grating has substantial reflection symmetry in a grating reflection plane;
wherein said radiation has a wave vector in said grating reflection plane;
and wherein said computation includes a rigorous coupled wave analysis having a symmetry reduced number of diffraction orders.

18. The system of claim 15, wherein said grating has a non-rectangular primitive lattice, and wherein a non-primitive unit cell of said grating includes said domain D and another domain D' having the same shape and orientation as D.

* * * * *